United States Patent
Nojeh et al.

(10) Patent No.: US 10,741,352 B2
(45) Date of Patent: Aug. 11, 2020

(54) OPTICALLY ADDRESSED, THERMIONIC ELECTRON BEAM DEVICE

(71) Applicants: The University of British Columbia, Vancouver (CA); The Board of Trustees of the Leland Stanford Junior University, Stanford, CA (US)

(72) Inventors: Alireza Nojeh, Vancouver (CA); Mike H. C. Chang, Vancouver (CA); Kais Dridi, Vancouver (CA); George Albert Sawatzky, Surrey (CA); Reuben Levi Paul, Vancouver (CA); R. Fabian W. Pease, Stanford, CA (US)

(73) Assignees: THE BOARD OF TRUSTEES OF THE LELAND STANFORD JUNIOR UNIVERSITY, Stanford, CA (US); THE UNIVERSITY OF BRITISH COLUMBIA, Vancouver, BC (CA)

( * ) Notice: Subject to any disclaimer, the term of this patent is extended or adjusted under 35 U.S.C. 154(b) by 0 days.

(21) Appl. No.: 16/474,424

(22) PCT Filed: Dec. 15, 2017

(86) PCT No.: PCT/CA2017/051523
§ 371 (c)(1),
(2) Date: Jun. 27, 2019

(87) PCT Pub. No.: WO2018/119513
PCT Pub. Date: Jul. 5, 2018

(65) Prior Publication Data
US 2019/0341217 A1    Nov. 7, 2019

Related U.S. Application Data

(60) Provisional application No. 62/440,205, filed on Dec. 29, 2016.

(51) Int. Cl.
| | |
|---|---|
| H01J 29/48 | (2006.01) |
| H01J 33/04 | (2006.01) |
| H01J 35/14 | (2006.01) |
| H01J 37/075 | (2006.01) |
| H01J 37/28 | (2006.01) |

(52) U.S. Cl.
CPC .............. *H01J 29/48* (2013.01); *H01J 33/04* (2013.01); *H01J 35/14* (2013.01); *H01J 37/075* (2013.01); *H01J 37/28* (2013.01)

(58) Field of Classification Search
CPC .. H01J 29/48; H01J 33/04; H01J 35/14; H01J 37/075; H01J 37/28; H01J 3/024
(Continued)

(56) References Cited

U.S. PATENT DOCUMENTS

| | | |
|---|---|---|
| 5,391,958 A | 2/1995 | Kelly |
| 6,057,637 A | 5/2000 | Zettl et al. |

(Continued)

FOREIGN PATENT DOCUMENTS

| | | |
|---|---|---|
| WO | 9428573 A1 | 12/1994 |
| WO | 9621238 A1 | 7/1996 |
| WO | 2013173922 A1 | 11/2013 |

OTHER PUBLICATIONS

International Search Report for related application No. PCT/CA2017/051523, dated Feb. 23, 2018.
(Continued)

*Primary Examiner* — Don P Le (57) ABSTRACT

An electron beam source is provided that includes a vessel forming a chamber, a cathode disposed within the chamber, the cathode comprising a low dimensional electrically conductive material having an anisotropic restricted thermal conductivity, an electrode disposed in the chamber, the electrode being connectable to a power source for applying a positive voltage to the electrode relative to the cathode for accelerating free electrons away from the cathode to form an (Continued)

electron beam when the cathode is illuminated by electromagnetic (EM) radiation such that the cathode thermionically emits free electrons, and an electron emission window in the chamber for passing a generated electron beam out of the chamber. An electron microscope that incorporates the electron beam source is also provided.

20 Claims, 9 Drawing Sheets

(58) Field of Classification Search
USPC .......................................................... 315/382
See application file for complete search history.

(56) References Cited

U.S. PATENT DOCUMENTS

| | | | |
|---|---|---|---|
| 6,850,595 B2 | 2/2005 | Zhou et al. | |
| 6,943,356 B2 * | 9/2005 | Schneiker | B82Y 10/00 |
| | | | 250/423 F |
| 7,847,207 B1 | 12/2010 | Chow et al. | |
| 8,148,661 B2 * | 4/2012 | Pershin | H05H 1/34 |
| | | | 219/121.36 |
| 2008/0217302 A1 | 9/2008 | Fink et al. | |
| 2014/0146947 A1 * | 5/2014 | Brau | H01J 3/022 |
| | | | 378/122 |

OTHER PUBLICATIONS

European Search Report for Europe Application No. 17887375 dated Jun. 17, 2020.

Yaghoobi, Parham et al., "Solar electron source and thermionic solar cell", AIP Advances 2, 042139, 2012 12 pages.

Yaghoobi, Parham et al., "Laser-Induced Electron Emission from Arrays of Carbon Nanotubes", The University of British Columbia, Apr. 2012, 106 pages.

* cited by examiner

OPTICALLY ADDRESSED, THERMIONIC ELECTRON BEAM DEVICE

FIELD

The present disclosure relates generally to a device for optically addressed, thermionically generating electron beams.

BACKGROUND

Electron beams (e-beams) are utilized in many applications, including electron microscopy, lithography, welding, opto-electron coupler/converters, and display screens. Traditionally, e-beam sources utilizing thermionic cathodes are large, expensive to manufacture, require a large amount of energy to generate an e-beam, and generally have internal pressures in the high vacuum regime, i.e., $10^{-6}$ Torr or less.

It is, therefore, desirable to provide a compact, low cost, low power e-beam source that could be utilized for various applications.

SUMMARY

According to an aspect of the disclosure, an electron beam source is provided that includes a vessel forming a chamber, a cathode disposed within the chamber, the cathode comprising a low dimensional electrically conductive material having an anisotropic restricted thermal conductivity, an electrode disposed in the chamber, the electrode being connectable to a power source for applying a positive voltage to the electrode relative to the cathode for accelerating free electrons away from the cathode to form an electron beam when the cathode is illuminated by electromagnetic (EM) radiation such that the cathode thermionically emits free electrons, and an electron emission window in the chamber for passing a generated electron beam out of the chamber.

According to another aspect of the disclosure, an electron microscope is provided that includes an electron source comprising a vessel forming a chamber, a cathode disposed within the chamber, the cathode comprising a low dimensional electrically conductive material having an anisotropic restricted thermal conductivity, an electrode disposed in the chamber, the electrode being connectable to a power source for applying a positive voltage to the electrode relative to the cathode for accelerating free electrons away from the cathode to form an electron beam when the cathode is illuminated by electromagnetic (EM) radiation such that the cathode thermionically emits free electrons; an electron emission window in the vessel for passing a generated electron beam out of the chamber, a sample stage for holding a sample, the sample stage located proximate to the electron emission window such that the generated electron beam from the electron beam source irradiates the sample stage, the sample stage comprising an electron detector to detect secondary and backscattered electrons from a sample held in the sample stage that is being irradiated with an electron beam generated by the electron beam source and a focusing element located between the electrode of the electron beam source and the sample stage for focusing an electron beam generated by the electron beam source on a sample on the sample stage, a scanning mechanism for performing one of mechanically moving the sample, and deflecting the electron beam incident on the sample stage, such that the electron beam is scanned over a sample held in the sample stage.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

DETAILED DESCRIPTION

Generally, the present disclosure provides a compact electron beam (e-beam) source that utilizes a small amount of input power and is cost effectively manufactured relative to traditional e-beam sources. The disclosed e-beam source may be a stand-alone module that may be easily incorporated, or replaced, within a device that utilizes e-beams. The present disclosure also provides a scanning electron microscope (SEM) that utilizes the disclosed e-beam source.

The e-beam sources of the present disclosure utilize a cathode comprising low dimensional, electrically conductive materials having anisotropically restricted thermal conductivity that may be optically heated to thermionically generate free electrons.

"Low dimensional" refers to a material in which the electrical and thermal behaviour differs from the bulk material and can be approximated by considering the material as being constrained to fewer than three dimensions. For example, the low dimensional material may be a "substantially one dimensional" or "quasi-one dimensional" material which, for the purpose of the present disclosure, are materials having lengths in two dimensions that are on the order of the wavelength of a phonon, being typically tens of nanometers, and are at least a factor of 5 shorter than the length of the third dimension. Non-limiting examples of substantially one-dimensional materials include nanotubes, nanowires, and nanofibers having a diameter less than 100 nm, and a length to diameter ratio of at least 5. For example, substantially one-dimensional materials include, but are not limited to, carbon nanotubes, boron-nitride nanotubes, tungsten nanowires, platinum nanowires, yttrium nanowires, gallium nitride nanowires, silicon nanowires, molybdenum nanowires, chromium nanowires, titanium nanowires, nickel nanowires, tantalum nanowires, rhenium nanowires, niobium nanowires, nanowires made of oxides such as, for example, silicon oxide, magnesium oxide, aluminum oxide, zinc oxide, barium oxide.

Such low-dimensional, electrically conductive materials having anisotropically restricted thermal conductivity may be heated to thermionic temperatures of 1000 K or more by irradiating the surface of the material with focused electromagnetic (EM) radiation such as, for example, focused laser light. When thermionic temperatures are reached in the cathode material, free electrons will be generated from the heated region.

Figure 1:
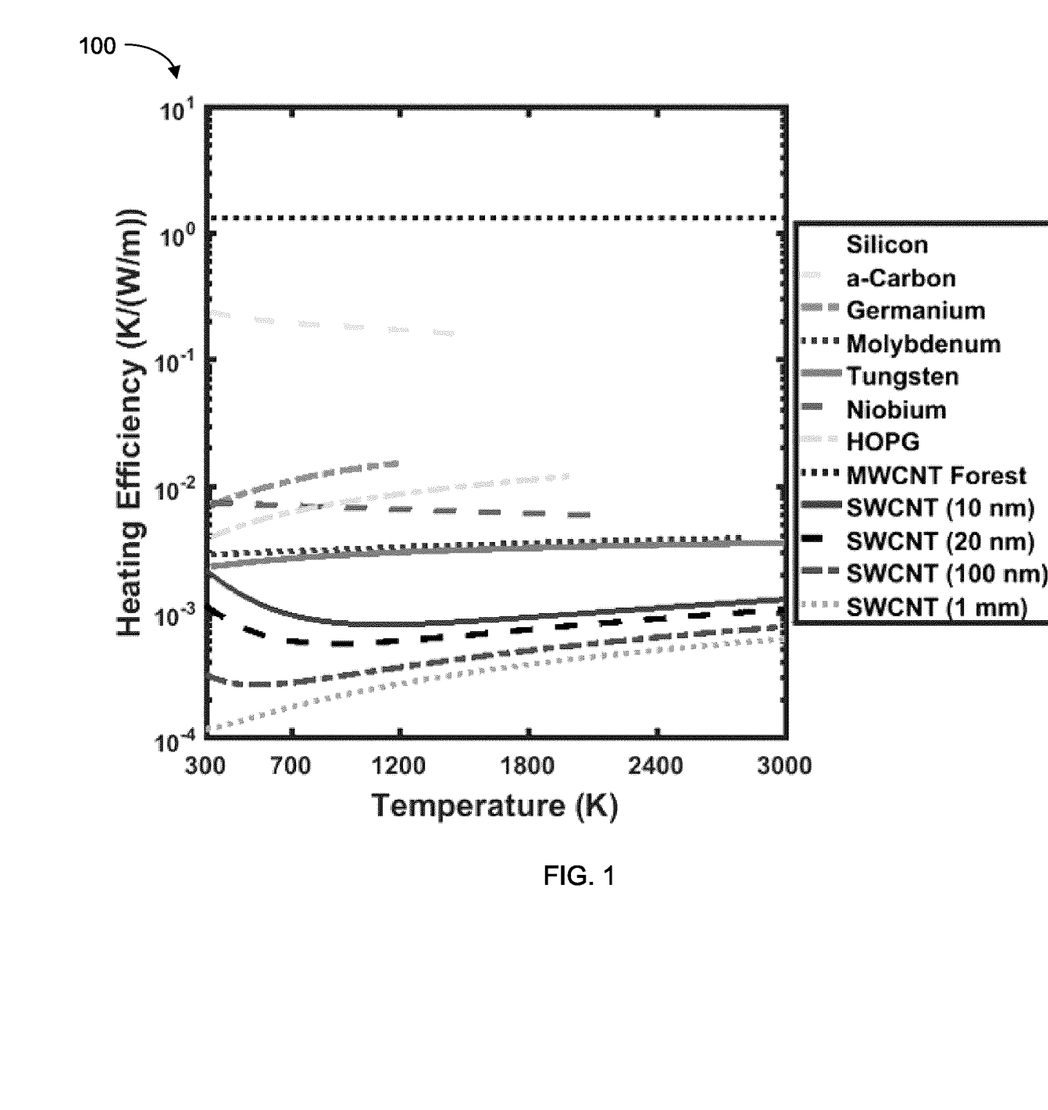
FIG. 1 is a graph showing the overall heating efficiency as a function of temperature for a variety of materials.

The wavelength of the EM radiation utilized to heat the cathode material may be selected to be, for example, ultraviolet, visible or infrared wavelengths depending on the absorptivity of the cathode material. The power of the EM radiation may be in the range of a less than a mW to a few hundreds of mW. Depending on the application, the illumination spot size will be in the range of a less than a micrometer to a few hundreds of micrometers. Due to the low-dimensional nature of the cathode material and the temperature dependence of thermal conductivity, EM radiation will heat the illuminated spot locally through what is known as the Heat Trap effect, which is characterized by strong localization of heat in a conductor, with minimal conductive loss. The Heat Trap effect can be understood with reference to the heating efficiency graph 100 shown in FIG. 1. FIG. 1 is a graph showing the overall heating efficiency as a function of temperature for a variety of materials. The graph 100 illustrates that anisotropic materials exhibit greater heating efficiency due to the Heat Trapping compared to non-anisotropic materials that do not experience the Heat Trapping effect.

In an example, materials suitable for the cathode of the disclosed e-beam sources are materials that, when a region of the material is irradiated with electromagnetic (EM) energy having a power density above a threshold, the region is heated and a temperature gradient having a magnitude of at least 0.1 K/µm is formed between the irradiated region and the remainder of the material such that free electrons are thermionically generated at the irradiated region.

The low dimensional material selected for the cathode may be a material having a heating efficiency that is greater than 0.1 K/(W/µm), where heating efficiency is defined as $$\frac{\Delta T}{\int_{T_0}^{T_0+\Delta T} k(\tau) \partial \tau} \frac{\sqrt{2}}{\pi^{\frac{3}{2}}(\alpha\beta\gamma^2)^{\frac{1}{4}}} \int_0^\infty [(u^2 + \sqrt{\alpha/\beta})(u^2 + \sqrt{\beta/\alpha})]^{-1/2} \partial u$$

where $\Delta T$ is the peak temperature rise in Kelvin, $T_0$ is the ambient temperature in Kelvin, $k(\tau)$ is the material's temperature-dependent thermal conductivity in W/mK, $\alpha$, $\beta$ and $\gamma$ are, respectively, the dimensionless thermal anisotropicity coefficients along the two axes of the surface irradiated with EM energy, and the axis perpendicular to the irradiated surface. Desirably, the heating efficiency of the material is greater than 0.1 K/(W/m), and more desirably greater than 1 K/(W/m).

Without wishing to be bound by theory, the threshold power density of the EM energy required to rapidly heat, for example, a substantially one-dimensional, thermally anisotropic material has been predicted to be inversely proportional to the square root of the area of the spot size because thermal anisotropy of strands of the one-dimensional material constrain the thermal conduction within the spot linearly along the length of the strands. This is more fully described in the thesis by P. Yaghoobi, "Laser-Induced Electron Emission from Arrays of Carbon Nanotubes" (see, for example, section 5.3.3), which may be found at https://open.library.ubc.ca/clRcle/collections/ubctheses/24/items/1.0072733, the entirety of which is hereby incorporated by reference herein.

Presently, cathode materials utilized in common e-beam sources are typically thermionic sources formed from bulk materials such as tungsten wires or lanthanum hexaboride. Utilizing cathodes made of the low dimensional materials described above facilitates manufacturing highly compact and inexpensive cathodes for use in, for example, a new class of SEMs that are extremely simple and inexpensive, costing on the order of a few hundred dollars, as compared to the cheapest SEM options presently which cost on the order to tens of thousands of dollars. A highly compact, low cost SEM makes high-resolution imaging available on a mass scale including clinics and laboratories in the developing world that would not otherwise have access to such imaging.

Figure 2A:
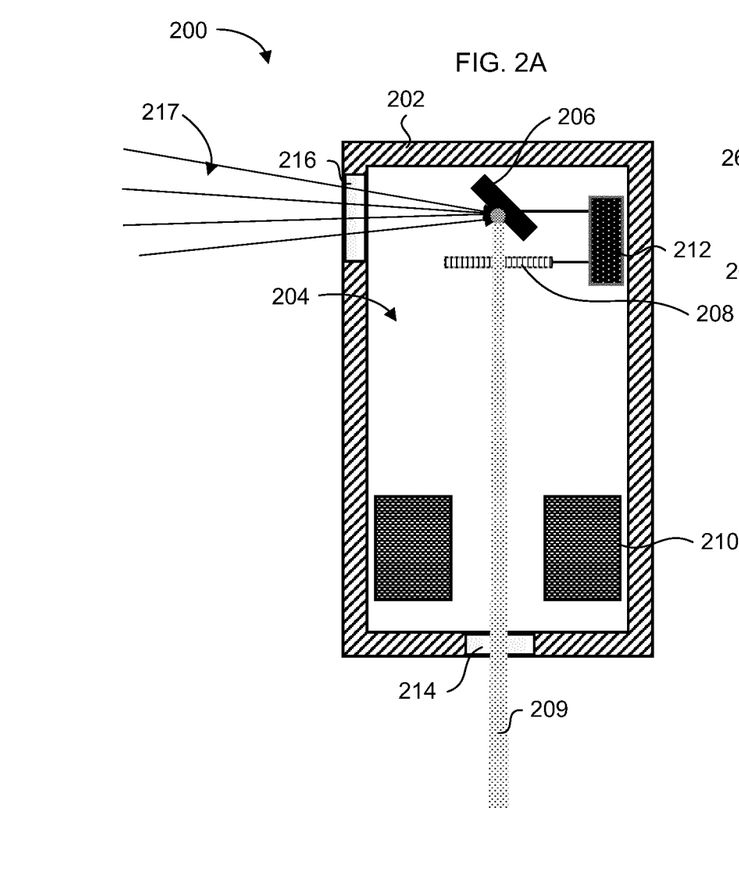
FIGS. 2A through 2C show cross-sectional views of example e-beam sources in accordance with the disclosure.
Figure 2B:
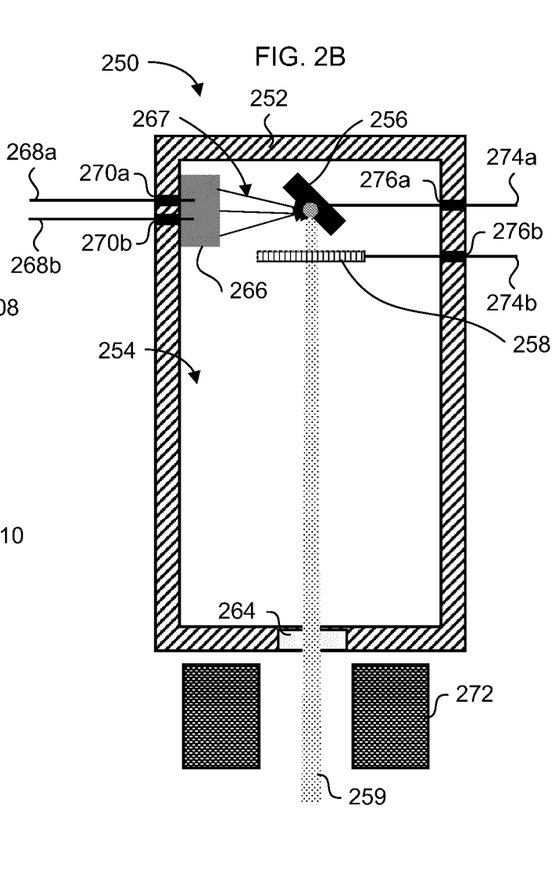

Referring now to FIGS. 2A and 2B, examples of e-beam sources are described. The e-beam source 200 shown in FIG. 2A includes a vessel 202 that defines a vacuum chamber 204. The vessel 202 may be made of any material suitable for forming a vacuum chamber 204 such as, for example, metal or glass. Although the vessels shown in the figures have a substantially rectangular shape, the vessels may have any suitable shape. For example, the vessel 202 may be formed of blown glass with a generally ovoid shape.

The vessel 202 of the example e-beam source 200 shown in FIG. 2A contains a cathode 206, an electrode 208, an optional internal electron focusing element 210, and an optional internal power source 212. The cathode 206, the electrode 208, the optional internal electron focusing element 210, and the optional internal power source 212 may be secured to the vessel 202 by any suitable means (not shown) including, for example, mounting brackets coupled to the vessel 202.

The cathode 206 is comprised of a low dimensional, electrically conductive material as described above. The dimensions of the cathode 206 may typically be from a fraction of a mm to a few mm on each side, although much larger dimensions may be used for certain applications. For example, utilizing larger cathodes may be desired to generate multiple e-beams from multiple beams of EM radiation, or of a wide beam of EM radiation is utilized to generate a wide electron beam.

As described above, the surface of the cathode 206 may be heated by EM energy in order for the cathode 206 to thermionically generate free electrons. In the e-beam source 200 shown in FIG. 2A, the EM energy 217 from an external source of EM radiation (not shown) passes into the e-beam source 200 through an EM window 216 in the vessel 202 to irradiate the surface of the cathode 206.

Although FIG. 2A shows rays of EM radiation entering through the EM window 216 in other embodiments the EM window 216 may be a sealed port in the vessel 202 through which an optical fiber may extend into the vacuum chamber 204. The optical fiber may be positioned proximal to the cathode 206 such that EM radiation from a source travels through the optical fiber and exits onto the surface of the cathode 206.

As described above, the EM radiation 217 may be from one of a number of sources including, for example, a laser, incandescent light source, or sunlight. The source of EM radiation may have a power in the range of less than a mW to a few hundreds of mW. Depending on the application, the illumination spot size will be in the range of less than a micrometer to a few hundreds of micrometers. Spot size may be determined by, for example, the width of the e-beam that is desired, or by a desired electron current of the e-beam, or both.

Given that thermionic emission from the disclosed low dimensional materials is possible at relatively low power of EM radiation 217, the source of EM radiation may be compact semiconductor lasers, such as battery powered handheld lasers or semiconductor lasers on a chip.

Spot size may be controlled by, for example, utilizing a lens (not shown) to focus the EM radiation 217 onto the cathode 206. The lens may be located external to the vessel 202, or may be included internally to focus the EM radiation 217 after entering the vessel 202.

Due to the low-dimensional nature of the cathode 206 and the temperature dependence of thermal conductivity, as described above, the EM radiation 217 heats the illuminated spot of the cathode 206 locally through the Heat Trap effect causing free electrons to be thermionically generated at the illuminated spot.

The electrode 208 and the cathode 206 may be separated by a distance of, for example, about 1 mm to a few mm. The electrode 208 has a positive bias voltage applied to it relative to the cathode 206 to accelerate the free electrons generated at the cathode 206 to form the e-beam 209. The positive bias voltage may be a few volts to a few hundred volts to thousands of volts depending on the electron energy of the e-beam 209 that is desired. A higher energy e-beam 209 may be desired if, for example, the e-beam 209 must exit through a relatively membrane forming the thick electron window 214, or through multiple electron windows. Further, higher energy electrons may facilitate focusing the e-beam 209 to a smaller cross-section, which may result in higher resolution when used in a SEM application. Lower energy electrons may be desired when the e-beam does not have to pass through a membrane forming the electron window 214, or to avoid damage to or heating of a specimen in, for example, a SEM application.

In some cases, a positive bias voltage applied to the electrode 208 relative to the cathode 206 may be provided by applying a negative voltage to the cathode 206 to repel the generated free electrons away from the cathode 206 to generate the e-beam 209. In this case, the electrode 208 may be grounded, or may have an applied positive voltage by a power source.

The electrode 208 may be formed by, for example, a metal plate having a hole in it for the e-beam to pass through. Alternatively, the electrode 208 may be, for example, a metal grid or mesh that includes a plurality of holes for the free electrons generated by the cathode 206 to pass through. In the embodiment shown in FIG. 2A, the positive bias voltage is applied by the optional internal power source 212 that is connected to the electrode 208 and the cathode 206. In other embodiments, the internal power source 212 may be omitted and the positive bias voltage may be applied to the electrode 208 by other means, such as an external power source connected to the cathode 206 and the electrode 208 by leads that pass through the vessel 202 (as shown in FIG. 2B, for example). The generated e-beam 209 exits the e-beam source 200 through an electron window 214 in the vessel 202.

The electron window 214 may be a thin membrane through which the e-beam 209 may pass. Materials suitable for forming a thin membrane electron window 214 include, for example, silicon oxide, nitride, aluminum oxide, and graphene. For example, approximately 0.5% of low energy electrons (i.e. 5 eV) have been shown to pass through multi-layer graphene with a total thickness of 100 nm. Electrons with higher energies will have substantially higher penetration ratios. Depending on the material and thickness of the membrane utilized for the electron window 214, and the level of output current of the e-beam 209 desired, the positive bias voltage applied to the electrode 208 may be sufficient to accelerate the electrons of the e-beam 209 to sufficiently high energies to exit through the electron window. Alternatively, an extra accelerating electrode placed inside or outside of the vessel 202 and with a sufficiently high positive bias voltage may be used to further accelerate the electrons of the e-beam 209, resulting in a higher ratio of electrons to pass through the electron window 214.

Providing a thin membrane electron window 214 enables the vessel 202 to be entirely sealed to maintain a vacuum environment in the vacuum chamber 204. The vacuum environment may be provided by evacuating the chamber 204 to a pressure of less than 0.1 Torr, and more desirably to less than $10^{-3}$ Torr, prior to sealing the vessel 202. Because the cathode 206 is heated by relatively low energy EM radiation 217, the vacuum within the chamber 204 may be poorer than the vacuum provided inside traditional e-beam sources. For example, the vacuum within the chamber 204 may be greater than, for example, $10^{-5}$ Torr, whereas traditional e-beam sources generally include internal environments in the high vacuum regime, i.e., $10^{-6}$ Torr or less.

Alternatively, rather than being entirely sealed, the vessel 202 may include a vent (not shown) that may be connected to an external vacuum pump (not shown) for providing a vacuum environment within the evacuated chamber 204. For example, rather than having a thin membrane as the electron window 214, the electron window 214 may be provided by a small opening in the vessel 202 through which the e-beam 209 may exit the e-beam source 200. In this example, the vessel 202 includes a vent (see FIG. 3A, for example) that may be connected to an external vacuum pump to maintain a vacuum environment within the chamber 204. The electron window 214 opening may be situated at an opposite end of the vessel 202 from the cathode 206 and may be sized such that the pressure at the end of the vessel 202 where the cathode 206 is situated remains less than 0.1 Torr and, desirably less than $10^{-2}$ Torr.

The optional internal electron focusing element 210 focuses the e-beam 209. The electron focusing element 210 may be any suitable focusing element such as, for example, a focusing magnet, an electromagnetic lens, an electrostatic lens, or a combination thereof. The optional internal electron focusing element 210 may be connected to a power supply (not shown) through leads (not shown) that extend through the vessel 202.

In other embodiments, the internal electron focusing element 210 may be omitted from the e-beam source 200. In such embodiments, e-beam 209 focusing may be provided by a separate, external focusing element, as described in more detail below with reference to FIG. 2B.

Referring to FIG. 2B, an alternative embodiment of an e-beam source 250 is shown that includes a vessel 252 that defines a vacuum chamber 254 that includes a cathode 256 and an electrode 258. The vessel 252 includes an electron window 264. The vessel 252, the cathode 256, the electrode 258, the electron window 264 may be substantially similar to the vessel 202, the cathode 206, the electrode 208, and the electron window 114 described previously and therefore are not further described here.

The e-beam source 250 includes an internal EM source 266 that provides the EM energy 267 utilized to heat the cathode 256. The internal EM source 266 may include electrical leads 268a, 268b that extend through sealed openings 270a, 270b in the vessel 252, as shown in FIG. 2B.

Although two sealed openings 270a, 270b are shown in FIG. 2B, the electrical leads 268a, 268b could pass through a single sealed port.

The electrical leads 268a, 268b may be coupled to a power supply to provide power to the EM source 266 for generating the EM radiation 267. The EM source 266 may be, for example, a solid state laser. Alternatively, rather than having leads 268a, 268b that extend through ports 270a, 270b, the internal EM source may include an internal power supply such as, for example, a battery.

Further, rather than utilizing the internal power supply 212 of the e-beam source 200 shown in FIG. 2A to provide a positive bias voltage at the electrode 258, electrical leads 274a, 274b coupled to the cathode 256 and the electrode 258, respectively, pass through respective sealed ports 276a, 276b such that the electrode 258 and the cathode 256 may be connected to an external power supply for providing the positive bias voltage at the electrode 258.

Further, the e-beam source 250 shown in FIG. 2B does not include the optional internal electron focusing element 210 included in the e-beam source 200 shown in FIG. 2A. Rather, an external electron focusing element 272 that is separate from the e-beam source 250 may be utilized to focus the e-beam 259 that exits the e-beam source 250. Alternatively, the external electron focusing element 272 may be positioned around the e-beam source 250 such that the e-beam 259 is focused before exiting the e-beam source 250, rather than after exiting as shown in FIG. 2B.

The example e-beam sources shown in FIGS. 2A and 2B are configured such that the EM radiation is incident on a front surface of the cathode. However, the EM radiation may be incident on, for example, the backside of the cathode and the e-beam is accelerated away from the cathode from the opposite, front side, as described below with reference to FIG. 2C.

Figure 2C:
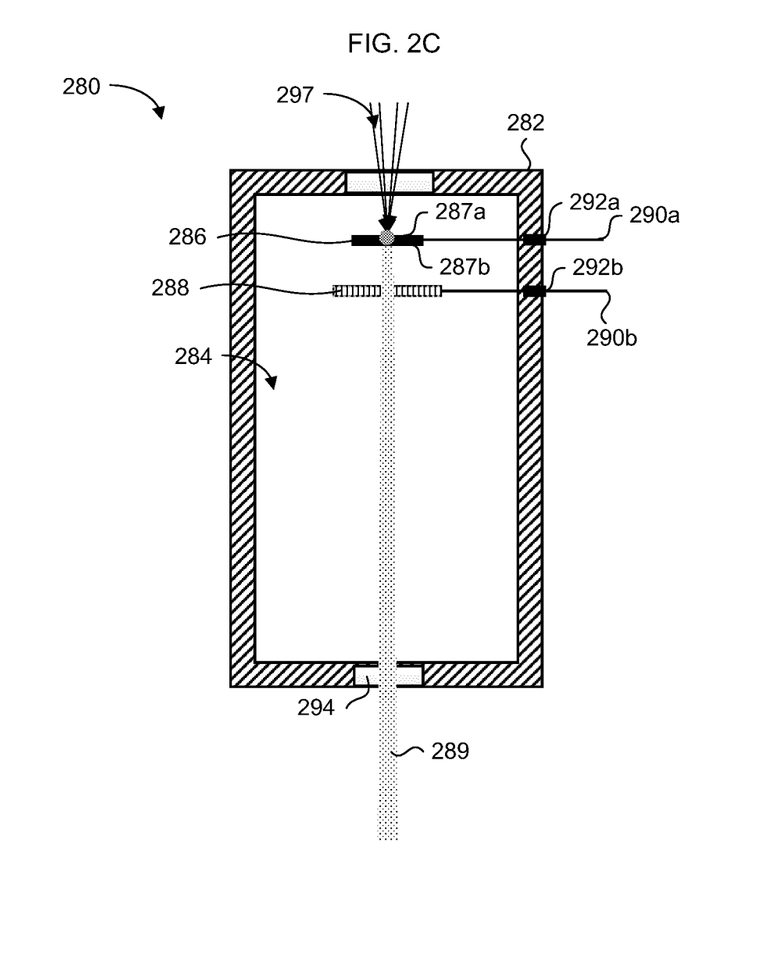

FIG. 2C shows an example e-beam source 280 that includes a vessel 282 that defines a vacuum chamber 284. The vessel 202 contains a cathode 286 and an electrode 288. The vessel 282 includes an electron window 294 and an EM window 296. The vessel 282, the cathode 286, the electrode 288, the electron window 294, and the EM window 296 may be substantially similar to the vessel 202, the cathode 206, the electrode 208, the electron window 114, and the EM window 116 described previously and therefore are not further described here. As with the e-beam source 250 shown in FIG. 2B, the cathode 286 and the electrode 288 include respective electrical leads 290a, 290b that pass through respective sealed ports 292a, 292b of the vessel 182 in order to provide the positive bias voltage to the electrode 288.

In the example e-beam source 280 shown in FIG. 2C, the EM window is situated behind the cathode 286 such that the EM radiation 297 is directed onto a back surface 287a of a cathode 186, which is the opposite of the front surface 287b that is closest to the electrode 188. The terms "front" and "back" are utilized herein to denote the orientation of the elements relative to other elements, as shown in the figures, and are not intended to be otherwise limiting.

Because the EM radiation is incident on the back surface 287a of the cathode 286, free electrons are generated at the back surface 287a. However, the free electrons then pass through the cathode 286 and are accelerated away from the cathode 286 at the front surface 287b due to the acceleration caused by the electrode 288. In addition, light and heat may penetrate the cathode 286 to cause heating at or near the front 287b. Therefore, the thickness of the cathode material 286, measured from the back surface 287a to the front surface 287b, is small enough to facilitate a sufficient number of the free electrons generated at the back surface 287a, in the internal region between the back surface 287a and the front surface 278b, to exit the cathode 286 at the front surface 287b to form the e-beam 289. The thickness of the cathode 286 that will facilitate light and heat or sufficient number of electrons pass to the front surface 287b in this configuration depends on the porosity and the density of the material that forms the cathode 286. For example, for a forest of carbon nanotubes, a thickness of approximately 100 μm or less is sufficient.

In general, electrons may be emitted from a surface of the cathode located nearest to the electrode, as illustrated in the examples shown in FIGS. 2A and 2B, or any other surface, such as a surface facing away from the electrode, or any other portion of the cathode. The location from which electrons are emitted from the cathode may depend, for example, on the configuration and characteristics of the cathode and the incident EM radiation. For example, illuminating a cathode with EM radiation having a higher power density may cause heating throughout the cathode material compared to EM radiation having a lower power density which may cause heating that is substantially confined to the surface of the cathode on which the EM radiation is incident. As another example, illuminating a cathode with EM radiation that is incident on a surface of the cathode that is facing away from the electrode may cause heating primarily at that illuminated surface such that electron emission is primarily from a surface that faces away from the electrode. Electrons emitted from any portion of the cathode may form an e-beam that is directed toward a specimen due to the accelerating voltage applied to the electrode.

In the e-beam sources 200, 250, 280 shown in FIGS. 2A through 2C, the EM radiation is directly incident on the cathode. However, in other embodiments the e-beam source may include a mirror that reflects EM radiation entering the vessel onto the cathode. Mirrors may be utilized to facilitate, for example, irradiating the front surface of the cathode without having the EM radiation obstructed by other elements or components of the e-beam source. Further, having curved mirrors that also act as a focusing element, that are closer to the cathode than may be possible through external or internal focusing elements, such as lenses, may facilitate better focusing of the EM radiation onto a smaller spot size, which as described above, generates a narrower e-beam which may be beneficial in some applications such as, for example, SEM applications.

FIGS. 3A through 3D show examples of e-beam sources 300, 330, 350, 370 that include mirrors to reflect EM radiation onto the cathode. All of the e-beam sources 300, 330, 350, 370 include a vessel 302 that defines a vacuum chamber 304. The vessel contains a cathode 306 and an electrode 308, and includes an EM window 316 and an electron window 314, all of which may be constructed substantially similar to vessel 202, the cathode 206, the electrode 208, the EM window 216, and the electron window 214 described previously with reference to FIG. 2A and therefore are not further described here.

The vessel 302 of the example e-beam sources 300, 330, 350, 370 includes a vent 320 that is connectable to an external vacuum pump (not shown) for providing a vacuum environment within the vacuum chamber 304. Further, the example e-beam sources 300, 330, 350, 370 may include other previously described optional elements that are not shown in FIGS. 3A through 3D. Although not shown for the sake of clarity, the example e-beam sources 300, 330, 350, 370 include one of an internal power source and electrical leads to apply the positive bias voltage to the electrodes 308. Further, the example e-beam sources 300, 330, 350, 370 may include optional internal electron focusing elements for focusing the generated e-beams 319.

Figure 3A:
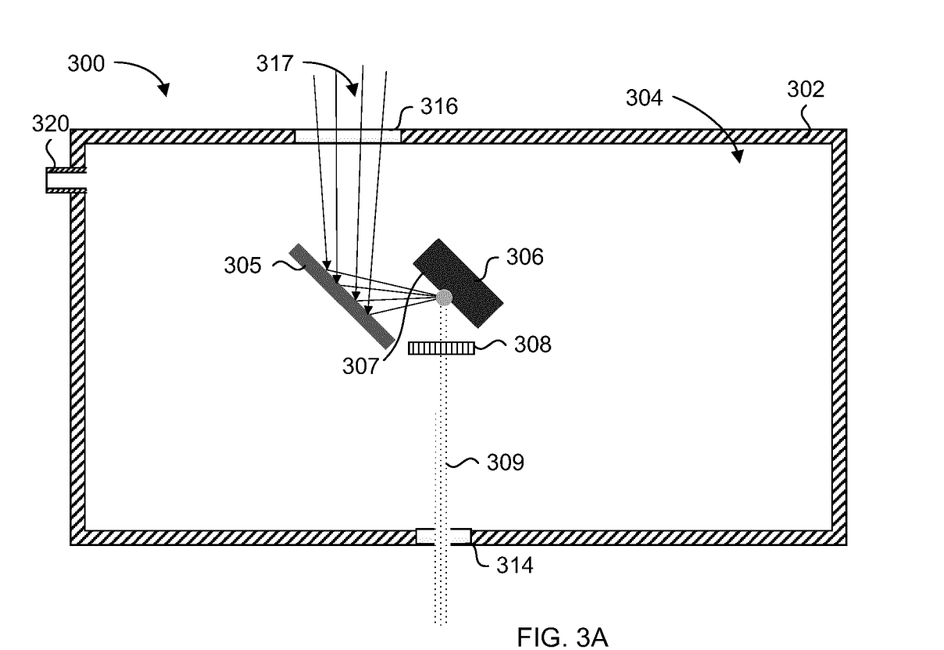
FIGS. 3A through 3D show cross-sectional views of example e-beam sources that include mirrors to direct EM radiation in accordance with the disclosure.

Referring now to FIG. 3A, the e-beam source 300 includes a mirror 305 that redirects EM radiation 317 that has passed through a EM window 316 located behind the cathode 306 onto the front surface 307 of the cathode 306. In the example e-beam source 300, the mirror 305 is substantially planar and the EM radiation 317 may be focused by an external lens (not shown) such that the focal point of the lens lies approximately at the front surface 307 of the cathode 306.

Figure 3B:
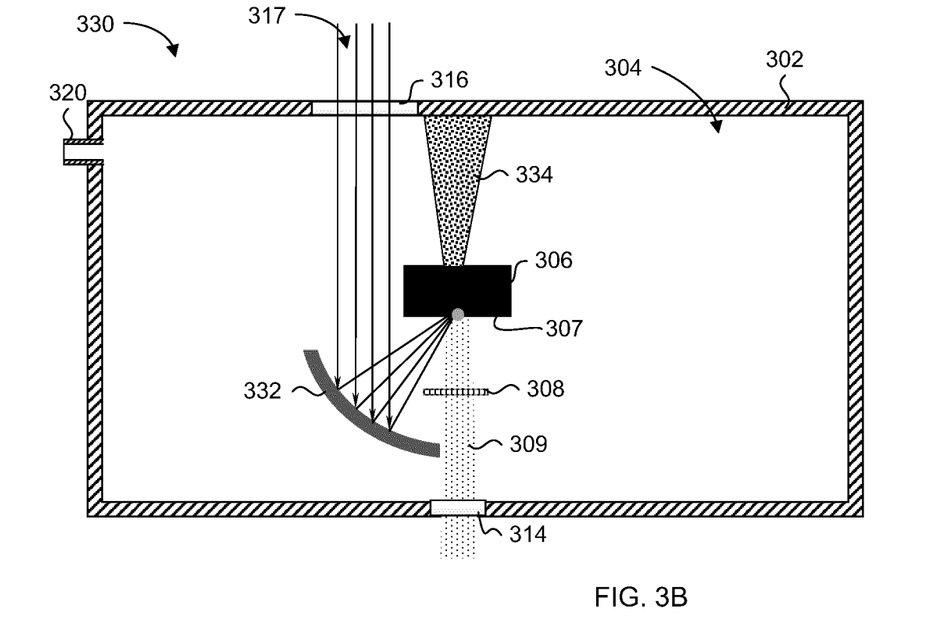
Figure 3C:
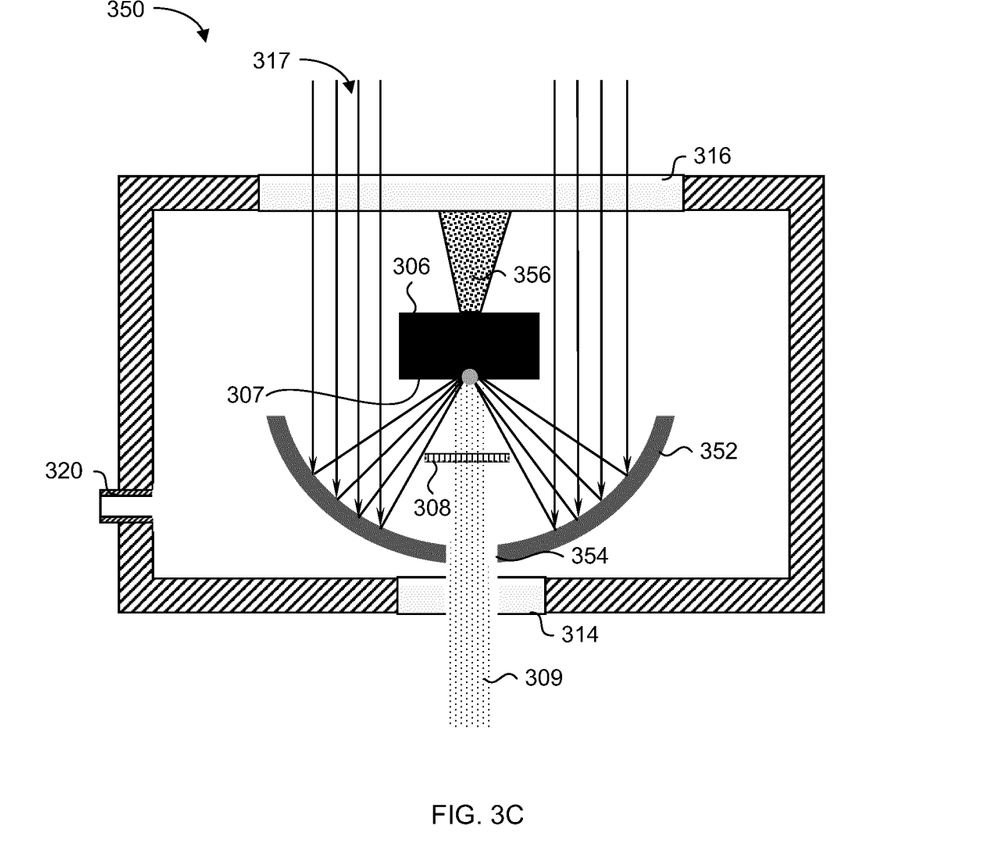
Figure 3D:
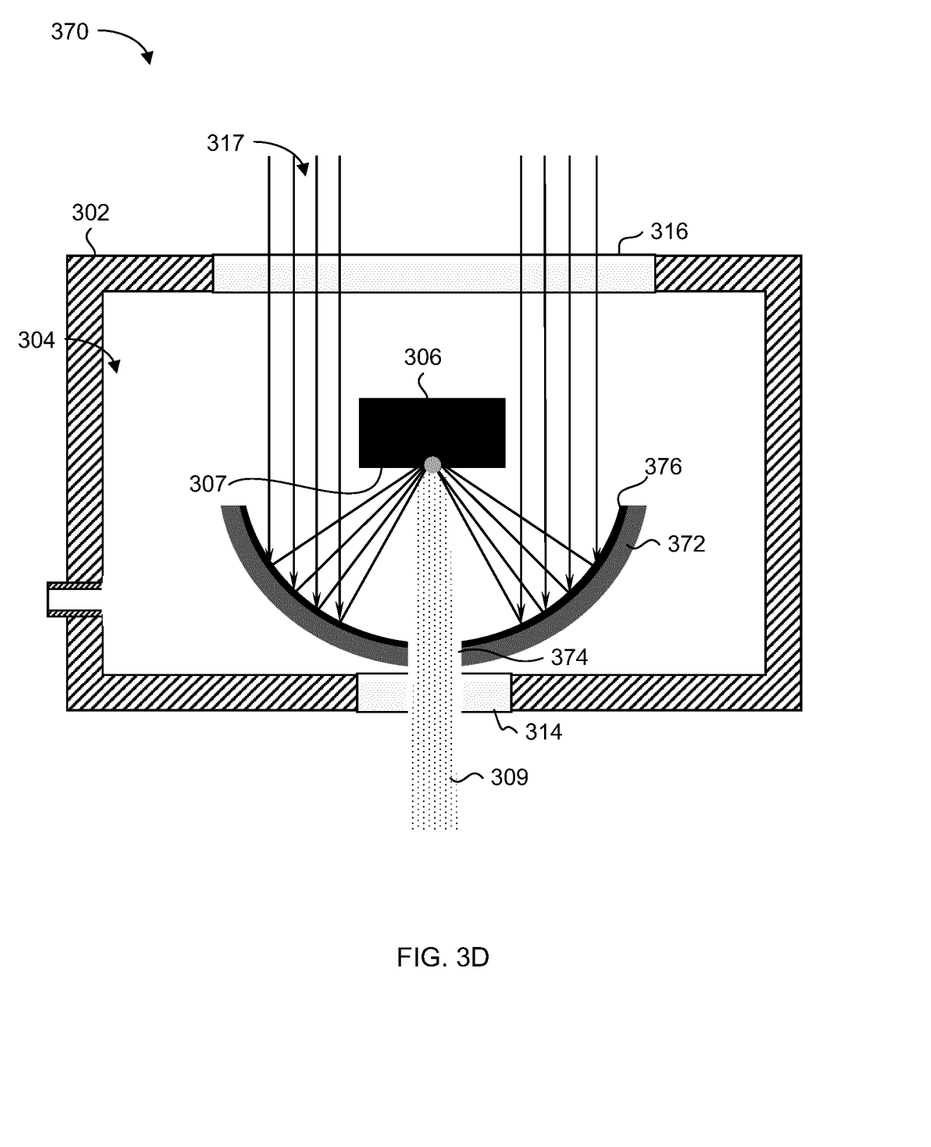

Rather than the planar mirror 305 included in e-beam source 300, other shapes of mirrors may be utilized. FIGS. 3B through 3D show examples of e-beam sources that include curved mirrors. FIG. 3B shows an example e-beam source 330 that includes a curved mirror 332. The curved mirror 332 may be a spherical or parabolic mirror and may be approximately situated such that the focal point of the mirror 332 lies on the front surface 307 of the cathode 306. In this arrangement, the EM radiation 317 comprises parallel rays that are focused onto front surface 307 of the cathode 308. In the example e-beam source 330, the cathode 308 is coupled to the vessel 302 by an actuator 334 that may be utilized to move the cathode 308 relative to the mirror 332. The actuator 334 may be utilized to make fine adjustments to the distance between the cathode 308 and the curved mirror 332 such that the spot size of the EM radiation 317 on the front surface 307 of the cathode 308 may be minimized.

The actuator 334 may use any suitable mechanism for moving the cathode 308 relative to the mirror 332 including, for example, a flexible diaphragm, a piezoelectric actuator, an electrical deflection actuator, a micro-electrical mechanical actuator, or any combination thereof. In an example, the flexible diaphragm may be provided by a flexible side of the vessel 302, such as a thin metallic sheet, to which the cathode 308 is mounted. A small pressure differential to the flexible diaphragm moves the diaphragm and the cathode 308. Alternatively, or in addition to the actuator 334 that moves the cathode 308, an actuator (not shown) of similar construction may couple the mirror 332 to the vessel 302 to move the mirror 332 relative to the cathode 308 in order to make fine adjustments to the location of the focal point.

The e-beam sources 300, 330 shown in FIGS. 3A and 3B include smaller mirrors that are located to one side of the cathode 308 so as not to obstruct the e-beam 209. However, larger mirrors may be included in order to direct more EM energy onto the cathode 308, or to utilize wider beams of EM radiation 317.

FIG. 3C shows an example e-beam source 350 having a curved mirror 352 that is larger than the curved mirror 332 of the e-beam source 330 shown in FIG. 3B. The curved mirror 352 includes an opening 354 that facilitates the e-beam 319 passing through the mirror 352. Similar to the mirror 332 of e-beam source 330, the curved mirror 352 may be a spherical or a parabolic mirror that is located relative to the cathode 308 such that the focal point of the mirror 352 is approximately at the front surface 307 of the cathode 308. Similarly, an actuator 356, similar to actuator 334 previously described, may couple the cathode 308 to the vessel 302 to fine tune the distance between the cathode 308 and the mirror 352.

FIG. 3D shows an e-beam source 370 having a curved mirror 372 having an opening 374. The curved mirror 372 may be substantially similar to the curved mirror 352 of e-beam source 350 except that the curved mirror 372 also includes a conductive coating 376. The conductive coating 376 may be connected to a power source such that a positive bias voltage may be applied to the conductive coating 376 relative to the cathode 308. In this way, in addition to reflecting EM radiation 317 onto the cathode 308, the mirror 372 also functions as the electrode 308 that accelerates the free electrons generated at the cathode 306 to form the e-beam 309. The conducting coating 376 may be formed by any optically reflective, conductive material, such as a metal film deposited on the surface of the curved mirror 372. Alternatively, an electrically conductive mirror may be used.

In alternative embodiments, the mirror utilized to direct EM radiation 317 onto the cathode 308 may be provided by a reflective coating provided on an inner surface of the vessel 302. For example, as described above, the vessel 302 may be formed of blown glass having an ovoid shape. The inner surface of the glass may be silvered such that the inner surface acts as a mirror that reflects EM radiation. In some cases, the vessel 202 may be blown to have a substantially spherical or parabolic shape at the region that is silvered, providing a spherical or parabolic mirror. In this case, the cathode 308 may be placed such that the focal point of the mirror is approximately at the surface of the cathode 308, and may additionally include an actuator, such as actuator 334 described above, for fine tuning the position of the cathode 308 relative to the mirrored surface of the vessel.

Due to the Heat Trap effect, the shape and size of the e-beam corresponds to the size and shape of the region on the cathode that is heated by the EM radiation, which in turn corresponds to the size and shape of the EM radiation incident on the cathode surface. Therefore, the geometrical shape of the illuminated spot on the cathode surface generally translates into the geometrical shape of the generated e-beam. In some instances, the surface of the cathode material may be shaped to control the shape of the illuminated spot on the cathode surface in order to generate an e-beam having a particular desired cross sectional shape, or to generate an e-beam that is narrower than the beam of EM radiation that irradiates the cathode. For example, a shaped surface of the cathode may be utilized to generate a narrow e-beam, or multiple e-beams, utilizing a single wide flood of EM radiation. In addition, the cathode surface may be shaped to, for example, generate an e-beam that is directional, or to enhance an electric field near the surface of the cathode, which may mitigate space charge effects.

Figure 4:
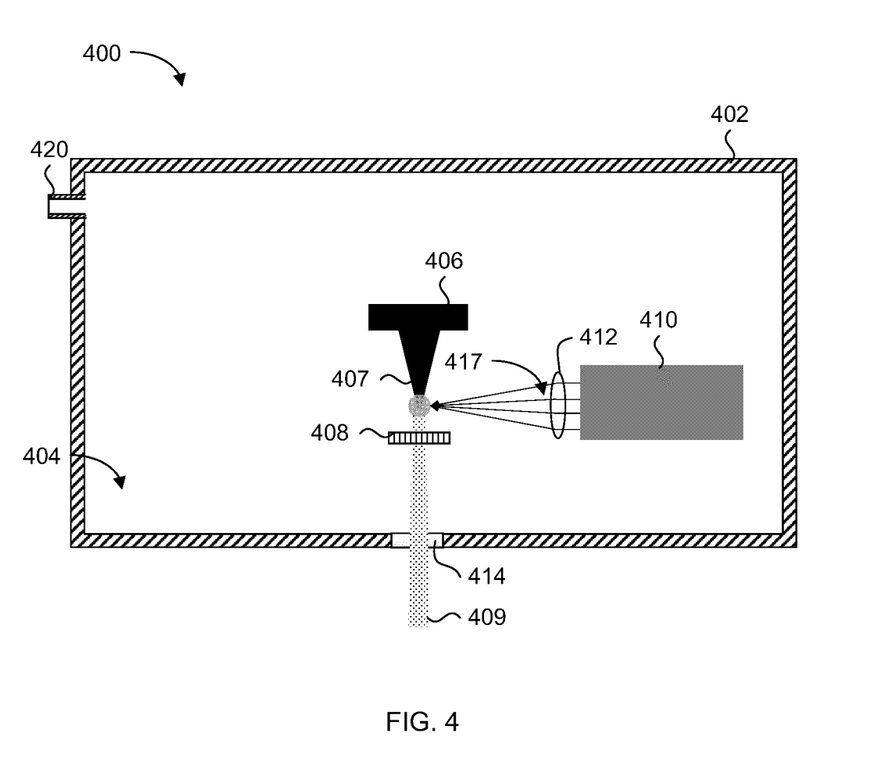
FIG. 4 shows a cross-sectional view of an example e-beam source that includes a cathode having a shaped surface in accordance with the disclosure.

FIG. 4 shows an example e-beam source 400 for producing a shaped e-beam 409. The e-beam source 400 includes a vessel 402 that defines a vacuum chamber 404. The vessel 402 contains a cathode 406 and an electrode 408. The vessel 402 includes an electron window 414 and a vent 420 that is connectable to an external vacuum pump (not shown) for providing an evacuated environment within the chamber 404. The example e-beam source 400 includes an optional internal EM radiation source 410 for generating EM radiation 317, and an optional lens 412 for focusing the EM radiation 417 onto the cathode 308. However, as described above, rather than the internal EM radiation source, the vessel may include an EM window to facilitate EM radiation from an external source to pass into the vessel 402 and irradiate the cathode 306. The vessel 402, the electrode 408, the electron window 414, the internal EM radiation source 410 may be constructed substantially similar to the similar elements described previously and therefore are not further described here.

The cathode 406 may be comprised of similar materials as previously described. However, the cathode 406 has a shaped surface 407. The shaped surface 407 may be provided by, for example, micromachining the surface 407 of the cathode 406 into the desired shape. The surface 407 may be shaped by any other suitable method.

Alternatively, or in addition to the shaped cathode, such as cathode 406 shown in FIG. 4, a shaped e-beam may be formed by illuminating the cathode with a shaped beam of EM radiation. Further, rather than having a single beam or EM radiation, an array of EM radiation beams may be utilized to irradiate one or multiple cathodes. Such an array of EM radiation beams could be provided by, for example, a single EM radiation source, a tophat beam shaper, and an array of lenses/mirrors, such as a micro-lens array or an array of MEMS mirrors, for projection of an array of arbitrarily-shaped beams. Alternatively, the array of EM radiation beams could be provided by multiple independent sources of EM radiation. Further, the response times of the electron generation relative to EM radiation illumination is on the order of a few tens of microseconds or higher and, therefore, modulating or chopping of the EM radiation may be performed to generate a timed or pulsed e-beam.

The e-beam sources disclosed above may be utilized to provide e-beams for any suitable application including, for example, electron microscopy, lithography, welding, optoelectron coupler/converters, and display screens.

Figure 5A:
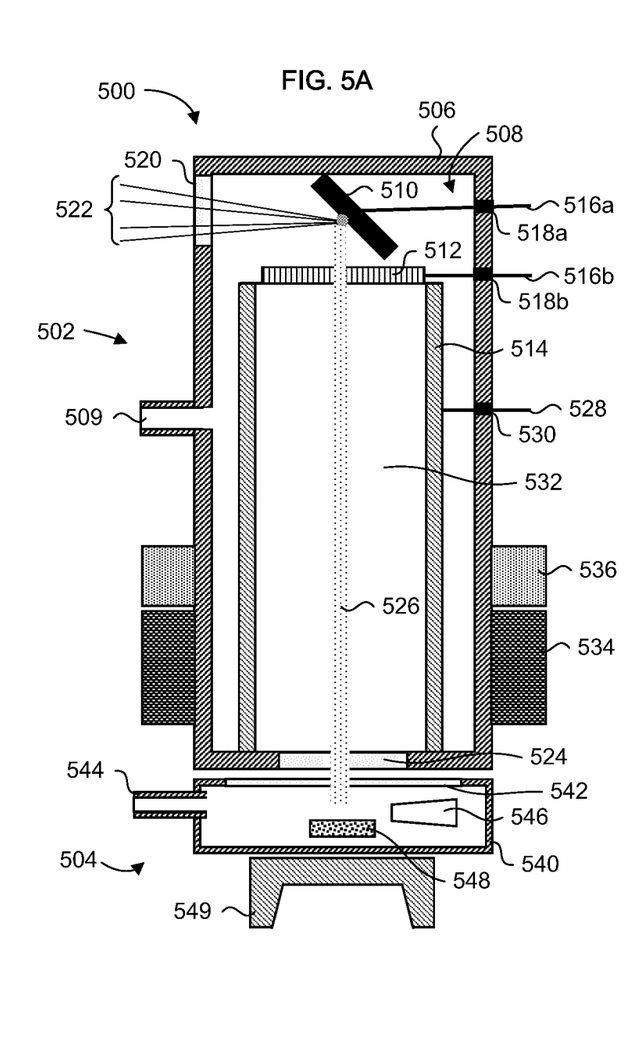
FIGS. 5A and 5B show cross-sectional views of example Scanning Electron Microscopes (SEMs) in accordance with the disclosure.
Figure 5B:
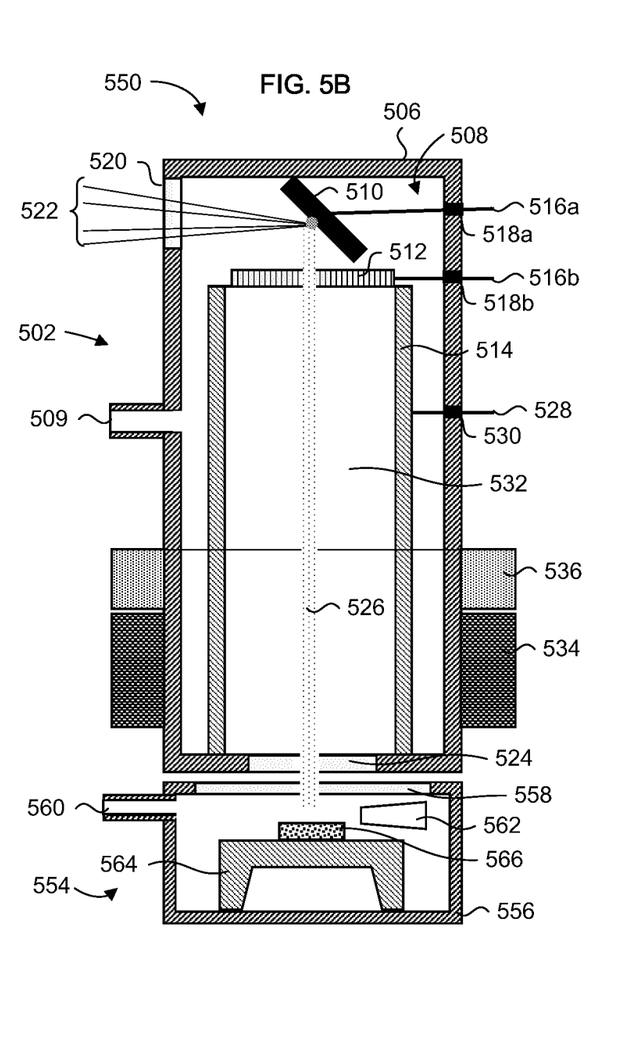
Figure 6:
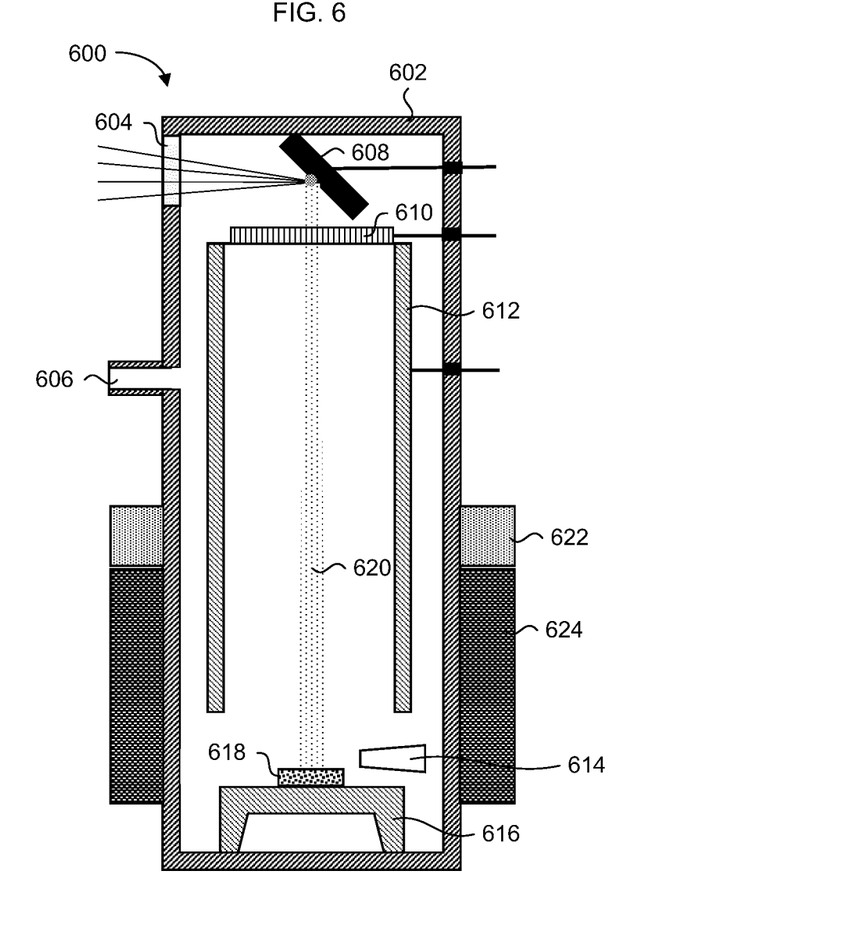
FIG. 6 shows a cross-sectional view of an example SEM housed in a single vessel in accordance with the disclosure.

With reference to FIGS. 5A, 5B and 6, various examples of a device for utilizing an e-beam source as described above for the specific application of SEM, are shown.

Referring to FIG. 5A, a SEM 500 includes an e-beam source 502 and a sample stage 504. The e-beam source 502 may be substantially similar to any of the previously described embodiments of an e-beam source. The e-beam source 502 in the example SEM 500 shown in FIG. 5A includes a vessel 506 that defines a vacuum chamber 508. The vessel 506 includes a vent 509 that is connectable to an external vacuum pump for providing a vacuum environment within the vacuum chamber 508. The vessel 506 contains a cathode 510, an electrode 512, and a metal tube 514. The vessel 506, the cathode 510, and the electrode 512 may be substantially similar to the cathodes and electrodes described previously. The cathode 510 and the electrode 512 include leads 516a, 516b that pass through sealed ports 518a, 518b in the vessel 506 to facilitate connecting the cathode 510 and the electrode 512 to an external power source in order to apply a positive bias voltage to the electrode 512 relative to the cathode, as previously described.

The vessel 506 includes an EM window 520 to facilitate EM radiation 522 entering the e-beam source 502, and an electron window 524 to facilitate the generated e-beam 526 exiting the e-beam source 502. The EM window 520 and electron window 524 may be substantially similar to the EM windows and electron windows previously described and therefore are not further described herein. Further, as previously described, rather than an EM window 520 through which external EM radiation 522 passes, the e-beam source 502 may include an internal EM radiation source. The vessel 506 includes a vent 509 that is connectable to an external vacuum pump (not shown) for providing the vacuum environment within the chamber 508. Alternatively, as disclosed above, the vessel 508 may be evacuated and sealed to form a vacuum environment within the chamber 508 without utilizing a vacuum pump on an ongoing basis.

Depending on the application, the metal tube 514 may be connected to electrical ground by lead 528 that passes through sealed port 530 in the vessel 506, or may be connected to a power supply to apply a voltage to the metal tube 514. The metal tube 514 may be utilized to reduce the presence of electrical fields in the region 532 inside the tube 514 such that the electrons of the e-beam 526 travel ballistically through the e-beam source 502 after being accelerated by the electrode 512. The metal tube 514 may also absorb stray electrons from the e-beam 526 to reduce charging and distortions of the electromagnetic landscape within the vacuum cavity 508. Although the metal tube 514 shown in the figures is continuous, the metal tube 514 may include gaps to allow fields from the electron focusing element 534 and electron steering element 536 to focus and steer the e-beam 526 as it passes through the metal tube 514.

The SEM 500 includes an electron focusing element 534 and an optional electron steering element 536. The electron focusing element 534 may be substantially similar to electron focusing elements described previously. Further, the electron focusing element may alternatively be located within the vessel 506, as described above. The optional electron steering element 536 may be formed by, for example, electrostatic deflector plates or electrostatic deflection coils, or any other suitable electrical, magnetic, or electromagnetic steering means. The optional electron steering element 536 may be utilized to scan the e-beam 526 over a sample held on the sample stage 504. As described below, the electron steering element 536 may be omitted and the e-beam may be scanned over a sample by moving the sample stage 504 relative to the e-beam 526.

The sample stage 504 in the example SEM 500 includes sample vessel 540 that includes an e-beam window 542 for the e-beam 526 to enter the sample vessel 540 and a vent 544 that is connectable to an external vacuum pump (not shown) to provide a vacuum environment within the sample stage 504. The sample vessel 540 contains an electron detector 546 to detect secondary electrons, backscattered electrons, or both from a sample 548 held within the sample stage 504 and irradiated by the e-beam 526 generated by the e-beam source 502. A sample actuator 549 is coupled to the sample vessel 540 for coarse movement of the sample stage 504 relative to the e-beam 526 in order to, for example, position a region of interest of the sample 548 into the e-beam 526. The sample actuator 549 may also be utilized for fine movement of the sample 548 relative to the e-beam during scanning in order to scan the e-beam over the region of interest, rather than, or in addition to, steering the e-beam 526 utilizing the electron steering element 536, as discussed above.

The sample actuator 549 may utilize any suitable mechanism for mechanically moving the sample stage 504. For example, the sample actuator 549 may include a piezoelectric actuator, a voice coil, or any other suitable type of actuator.

Rather than the sample actuator 549 moving the entire sample stage 504, as show in FIG. 5A, a sample actuator may be included inside the sample vessel and move only the sample itself, as shown in FIG. 5B.

FIG. 5B shows another example of an SEM 550 that includes the e-beam source 552 that is substantially similar to the e-beam source 502 of SEM 500 that is described previously and therefore is not further described here. The SEM 550 includes a sample stage 554 that includes a sample vessel 556 having an electron window 558 and vent 560, as described above with reference to sample stage 504. The sample vessel 556 contains a detector 562, similar to detector 546. However, the sample vessel 556 of SEM 550 also contains a sample actuator 564 that holds and moves the sample 566 relative to the e-beam 568 for coarse and fine movements, as described above, but by moving the sample 566 only, rather than the entire sample stage. The sample actuator 564 may be substantially similar to the sample actuator 549 described above.

In the SEM 500, 550 shown in FIGS. 5A and 5B, the e-beam sources 502, 552 and the sample stages 504, 554 include separate vessels. However, the e-beam source and the sample stage of the SEM may be housed within a single vessel, as described in more detail below with reference to FIG. 6.

FIG. 6 shows an example SEM 600 that includes a vessel 602 having an EM window 604 and a vent 606. The vessel 602 contains elements of the e-beam source including a cathode 608, and electrode 610 and a metal tube 612, which are substantially similar to the cathode 510, the electrode 512, and the metal tube 514 previously described with reference to FIG. 5A. The vessel 602 also contains elements of the sample stage including a detector 614 and a sample actuator 616 for moving the sample 618 relative to the e-beam 620. The sample actuator 616 and the detector 614 are substantially similar to the sample actuator 549 and the detector 546 described previously with reference to FIG. 5A and therefore are not further described herein. The SEM 600 may also include a beam steering element 622 and an electron focusing element 624 that are substantially similar to the beam steering element 536 and the electron focusing element 534 described previously with reference to FIG. 5A.

Alternatively, rather than the sample stage included within its own vessel or within the vessel of the e-beam source, a larger vessel may house the detector and sample actuator and the e-beam source including the e-beam source vessel.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

What is claimed is:

1. An electron beam source comprising:
a vessel forming a chamber;
a cathode disposed within the chamber, the cathode comprising a low dimensional electrically conductive material having an anisotropic restricted thermal conductivity;
an internal electromagnetic (EM) radiation source disposed within the vessel for providing EM radiation to the cathode, or an EM window for EM radiation from an external EM source to enter the vessel, or both an internal EM radiation source disposed within the vessel for providing EM radiation to the cathode and an EM window for EM radiation from an external EM source to enter the vessel, to illuminate a portion of the cathode with EM radiation to cause thermionic emission of free electrons from the illuminated portion of the cathode;
an electrode disposed in the chamber, the electrode being connectable to a power source for applying a positive voltage to the electrode relative to the cathode for accelerating free electrons away from the cathode to form an electron beam when the cathode is illuminated by EM radiation such that the cathode thermionically emits free electrons;
an electron emission window in the chamber for passing a generated electron beam out of the chamber.

2. The electron beam source of claim 1, wherein the cathode is disposed at a first end of the chamber, and the electron emission window is an opening at a second end of the chamber opposite the first end, the opening sized such that a pressure at the first end is less than $10^{-2}$ Torr; and
the chamber further comprising a vent connectable to a pump for maintaining the pressure at the first end of the chamber.

3. The electron beam source of claim 1, wherein the electron emission window is a thin membrane such that the vessel is sealed.

4. The electron source of claim 1, further comprising:
a focusing magnet, electromagnetic lens or electrostatic lens disposed in the chamber for focusing the accelerated beam of free electrons.

5. The electron source of claim 1, comprising the EM window and wherein EM window is an opening for an optical fibre to extend into the chamber.

6. The electron source of claim 1, further comprising the EM window and a mirror disposed in the chamber, the mirror positioned such that EM radiation passing through the EM window is reflected onto a surface of the cathode.

7. The electron source of claim 6, wherein the mirror is one of a spherical mirror and a parabolic mirror, wherein the mirror is positioned such that the cathode is approximately located at a focal point of the one of spherical or parabolic mirror such that EM radiation passing through the EM window is focused by the curved mirror onto a surface of the cathode.

8. The electron source of claim 7, wherein the mirror has an opening for the generated electron beam to pass through the mirror.

9. The electron source of claim 8, wherein the mirror has a conductive coating such that the mirror forms the electrode for accelerating free electrons away from the cathode.

10. The electron source of claim 7, wherein the vessel has an ovoid shape and the mirror is formed by a reflective surface on an inner surface of the vessel.

11. The electron source of claim 7, further comprising an actuator coupled to the cathode to adjust the position of the cathode relative to the curved mirror for fine adjustment of the cathode relative to the focal point of the mirror.

12. The electron source of claim 11, wherein the actuator is one of a flexible diaphragm, a piezoelectric actuator, an electrical deflection actuator, and a micro-electrical mechanical actuator.

13. The electron beam source of claim 1, wherein a surface of the cathode is shaped such that a shape of the illuminated portion of the cathode corresponds to a desired cross-sectional shape of the electron beam.

14. The electron beam source of claim 1, wherein a cross-section of the EM radiation that illuminates the cathode is shaped such that a shape of the illuminated portion of the cathode corresponds to a desired cross-sectional shape of the electron beam.

15. An electron microscope comprising:
an electron source comprising:
a vessel forming a chamber;
a cathode disposed within the chamber, the cathode comprising a low dimensional electrically conductive material having an anisotropic restricted thermal conductivity;
an electrode disposed in the chamber, the electrode being connectable to a power source for applying a positive voltage to the electrode relative to the cathode for accelerating free electrons away from the cathode to form an electron beam when the cathode is illuminated by electromagnetic (EM) radiation such that the cathode thermionically emits free electrons;
an electron emission window in the vessel for passing a generated electron beam out of the chamber;
a sample stage for holding a sample, the sample stage located proximate to the electron emission window such that the generated electron beam from the electron beam source irradiates the sample stage, the sample stage comprising:
an electron detector to detect secondary and backscattered electrons from a sample held in the sample stage that is being irradiated with an electron beam generated by the electron beam source
a focusing element located between the electrode of the electron beam source and the sample stage for focusing an electron beam generated by the electron beam source on a sample on the sample stage;
a scanning mechanism for performing one of mechanically moving the sample, and deflecting the electron beam incident on the sample stage, such that the electron beam is scanned over a sample held in the sample stage.

16. The electron microscope of claim 15, wherein the vessel includes an electromagnetic (EM) window for EM radiation from an EM radiation source to enter the chamber to illuminate a portion of the cathode to cause thermionic emission of free electrons from the illuminated portion of the cathode.

17. The electron microscope of claim 15, wherein the scanning mechanism is one of a piezoelectric actuator and a voice coil coupled to the sample stage for mechanically moving the sample stage relative to the electron beam incident on the sample stage for scanning a sample held in the sample stage.

18. The electron microscope of claim 15, wherein the scanning mechanism is one of electrostatic deflector plates or electrostatic deflection coils for deflecting the electron beam incident on the sample stage for scanning a sample held in the sample stage.

19. The electron microscope of claim 15, wherein the sample stage comprises a sample vessel that forms a sample chamber, wherein the detector is disposed in the sample chamber.

20. The electron microscope of claim 19, wherein the sample vessel is the vessel of the electron beam source.

* * * * *